United States Patent
Colgrove et al.

(10) Patent No.: US 10,432,233 B1
(45) Date of Patent: *Oct. 1, 2019

(54) ERROR CORRECTION PROCESSING IN A STORAGE DEVICE

(71) Applicant: Pure Storage, Inc., Mountain View, CA (US)

(72) Inventors: John Colgrove, Los Altos, CA (US); Ethan Miller, Santa Cruz, CA (US)

(73) Assignee: Pure Storage Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/028,933

(22) Filed: Jul. 6, 2018

Related U.S. Application Data

(63) Continuation of application No. 14/925,255, filed on Oct. 28, 2015.

(51) Int. Cl.
*G06F 11/10* (2006.01)
*H03M 13/35* (2006.01)

(52) U.S. Cl.
CPC ....... *H03M 13/353* (2013.01); *G06F 11/1012* (2013.01); *G06F 11/1076* (2013.01)

(58) Field of Classification Search
CPC .............. H03M 13/353; G06F 11/1012; G06F 11/1076; H01L 25/18; G11C 29/44; G11C 29/52; G11C 29/42; G11C 2029/0409; G11B 20/18

See application file for complete search history.

(56) References Cited

U.S. PATENT DOCUMENTS

| | | | |
|---|---|---|---|
| 5,706,210 A | 1/1998 | Kumano et al. | |
| 5,799,200 A | 8/1998 | Brant et al. | |
| 5,933,598 A | 8/1999 | Scales et al. | |
| 6,012,032 A | 1/2000 | Donovan et al. | |
| 6,085,333 A | 7/2000 | DeKoning et al. | |
| 6,643,641 B1 | 11/2003 | Snyder | |
| 6,647,514 B1 | 11/2003 | Umberger et al. | |
| 6,789,162 B1 | 9/2004 | Talagala et al. | |
| 7,089,272 B1 | 8/2006 | Garthwaite et al. | |

(Continued)

FOREIGN PATENT DOCUMENTS

| | | |
|---|---|---|
| CN | 108351819 A | 7/2018 |
| EP | 0725324 A2 | 8/1996 |

(Continued)

OTHER PUBLICATIONS

Paul Sweere, *Creating Storage Class Persistent Memory with NVDIMM*, Published in Aug. 2013, Flash Memory Summit 2013, <http://ww.flashmemorysummit.com/English/Collaterals/Proceedings/2013/20130814_T2_Sweere.pdf>, 22 pages.

(Continued)

*Primary Examiner* — Phung M Chung

(57) ABSTRACT

Dynamically adjusting an error correction effort level of a storage device, including: receiving, from a storage array controller, an error correction effort level to perform when attempting to read data from the storage device; identifying that an attempt to read the data resulted in an error; and determining whether an amount of error correction effort level required to attempt to correct the error exceeds the error correction effort level to perform when attempting to read data from the storage device.

17 Claims, 5 Drawing Sheets

(56) References Cited

U.S. PATENT DOCUMENTS

| | | |
|---|---|---|
| 7,107,389 B2 | 9/2006 | Inagaki et al. |
| 7,146,521 B1 | 12/2006 | Nguyen |
| 7,334,124 B2 | 2/2008 | Pham et al. |
| 7,437,530 B1 | 10/2008 | Rajan |
| 7,493,424 B1 | 2/2009 | Bali et al. |
| 7,669,029 B1 | 2/2010 | Mishra et al. |
| 7,689,609 B2 | 3/2010 | Lango et al. |
| 7,743,191 B1 | 6/2010 | Liao |
| 7,899,780 B1 | 3/2011 | Shmuylovich et al. |
| 8,042,163 B1 | 10/2011 | Karr et al. |
| 8,086,585 B1 | 12/2011 | Brashers et al. |
| 8,156,398 B2 * | 4/2012 | Sommer ............. G06F 11/1072 714/752 |
| 8,200,887 B2 | 6/2012 | Bennett |
| 8,271,700 B1 | 9/2012 | Annem et al. |
| 8,387,136 B2 | 2/2013 | Lee et al. |
| 8,437,189 B1 | 5/2013 | Montierth et al. |
| 8,465,332 B2 | 6/2013 | Hogan et al. |
| 8,484,542 B2 | 7/2013 | d'Abreu et al. |
| 8,527,544 B1 | 9/2013 | Colgrove et al. |
| 8,566,546 B1 | 10/2013 | Marshak et al. |
| 8,578,442 B1 | 11/2013 | Banerjee |
| 8,613,066 B1 | 12/2013 | Brezinski et al. |
| 8,620,970 B2 | 12/2013 | English et al. |
| 8,751,463 B1 | 6/2014 | Chamness |
| 8,762,642 B2 | 6/2014 | Bates et al. |
| 8,769,622 B2 | 7/2014 | Chang et al. |
| 8,775,868 B2 | 7/2014 | Colgrove et al. |
| 8,800,009 B1 | 8/2014 | Beda, III et al. |
| 8,812,860 B1 | 8/2014 | Bray |
| 8,850,546 B1 | 9/2014 | Field et al. |
| 8,898,346 B1 | 11/2014 | Simmons |
| 8,909,854 B2 | 12/2014 | Yamagishi et al. |
| 8,931,041 B1 | 1/2015 | Banerjee |
| 8,935,595 B2 * | 1/2015 | Zhong ................. G11C 11/5642 714/773 |
| 8,949,863 B1 | 2/2015 | Coatney et al. |
| 8,954,822 B2 | 2/2015 | Frayer et al. |
| 8,984,602 B1 | 3/2015 | Bailey et al. |
| 8,990,905 B1 | 3/2015 | Bailey et al. |
| 9,081,713 B1 | 7/2015 | Bennett |
| 9,124,569 B2 | 9/2015 | Hussain et al. |
| 9,128,858 B1 | 9/2015 | Micheloni et al. |
| 9,134,922 B2 | 9/2015 | Rajagopal et al. |
| 9,189,334 B2 | 11/2015 | Bennett |
| 9,209,973 B2 | 12/2015 | Aikas et al. |
| 9,241,769 B2 | 1/2016 | Larkin et al. |
| 9,250,823 B1 | 2/2016 | Kamat et al. |
| 9,300,660 B1 | 3/2016 | Borowiec et al. |
| 9,311,182 B2 | 4/2016 | Bennett |
| 9,348,696 B2 | 5/2016 | Colgrove et al. |
| 9,444,822 B1 | 9/2016 | Borowiec et al. |
| 9,448,881 B1 | 9/2016 | Micheloni et al. |
| 9,507,532 B1 | 11/2016 | Colgrove et al. |
| 9,594,633 B2 | 3/2017 | Colgrove et al. |
| 9,632,870 B2 | 4/2017 | Bennett |
| 2002/0013802 A1 | 1/2002 | Mori et al. |
| 2003/0145172 A1 | 7/2003 | Galbraith et al. |
| 2003/0191783 A1 | 10/2003 | Wolczko et al. |
| 2003/0225961 A1 | 12/2003 | Chow et al. |
| 2004/0080985 A1 | 4/2004 | Chang et al. |
| 2004/0111573 A1 | 6/2004 | Garthwaite |
| 2004/0153844 A1 | 8/2004 | Ghose et al. |
| 2004/0193814 A1 | 9/2004 | Erickson et al. |
| 2004/0260967 A1 | 12/2004 | Guha et al. |
| 2005/0160416 A1 | 7/2005 | Jamison |
| 2005/0188246 A1 | 8/2005 | Emberty et al. |
| 2005/0216800 A1 | 9/2005 | Bicknell et al. |
| 2006/0015771 A1 | 1/2006 | Van Gundy et al. |
| 2006/0129817 A1 | 6/2006 | Borneman et al. |
| 2006/0161726 A1 | 7/2006 | Lasser |
| 2006/0230245 A1 | 10/2006 | Gounares et al. |
| 2006/0239075 A1 | 10/2006 | Williams et al. |
| 2007/0022227 A1 | 1/2007 | Miki |
| 2007/0028068 A1 | 2/2007 | Golding et al. |
| 2007/0055702 A1 | 3/2007 | Fridella et al. |
| 2007/0109856 A1 | 5/2007 | Pellicone et al. |
| 2007/0150689 A1 | 6/2007 | Pandit et al. |
| 2007/0162826 A1 * | 7/2007 | Major ................. H03M 13/03 714/763 |
| 2007/0168321 A1 | 7/2007 | Saito et al. |
| 2007/0220227 A1 | 9/2007 | Long |
| 2007/0294563 A1 | 12/2007 | Bose |
| 2007/0294564 A1 | 12/2007 | Reddin et al. |
| 2008/0005587 A1 | 1/2008 | Ahlquist |
| 2008/0077825 A1 | 3/2008 | Bello et al. |
| 2008/0162674 A1 | 7/2008 | Dahiya |
| 2008/0195833 A1 | 8/2008 | Park |
| 2008/0270678 A1 | 10/2008 | Cornwell et al. |
| 2008/0282045 A1 | 11/2008 | Biswas et al. |
| 2009/0077340 A1 | 3/2009 | Johnson et al. |
| 2009/0100115 A1 | 4/2009 | Park et al. |
| 2009/0198889 A1 | 8/2009 | Ito et al. |
| 2010/0052625 A1 | 3/2010 | Cagno et al. |
| 2010/0211723 A1 | 8/2010 | Mukaida |
| 2010/0246266 A1 | 9/2010 | Park et al. |
| 2010/0257142 A1 | 10/2010 | Murphy et al. |
| 2010/0262764 A1 | 10/2010 | Liu et al. |
| 2010/0325345 A1 | 12/2010 | Ohno et al. |
| 2010/0332754 A1 | 12/2010 | Lai et al. |
| 2011/0072290 A1 | 3/2011 | Davis et al. |
| 2011/0125955 A1 | 5/2011 | Chen |
| 2011/0131231 A1 | 6/2011 | Haas et al. |
| 2011/0167221 A1 | 7/2011 | Pangal et al. |
| 2012/0023144 A1 | 1/2012 | Rub |
| 2012/0054264 A1 | 3/2012 | Haugh et al. |
| 2012/0079318 A1 | 3/2012 | Colgrove et al. |
| 2012/0084622 A1 | 4/2012 | D'Abreu et al. |
| 2012/0131253 A1 | 5/2012 | McKnight et al. |
| 2012/0303919 A1 | 11/2012 | Hu et al. |
| 2012/0311000 A1 | 12/2012 | Post et al. |
| 2013/0007845 A1 | 1/2013 | Chang et al. |
| 2013/0031414 A1 | 1/2013 | Dhuse et al. |
| 2013/0036272 A1 | 2/2013 | Nelson |
| 2013/0071087 A1 | 3/2013 | Motiwala et al. |
| 2013/0139035 A1 | 5/2013 | Zhong et al. |
| 2013/0145447 A1 | 6/2013 | Maron |
| 2013/0191555 A1 | 7/2013 | Liu |
| 2013/0198459 A1 | 8/2013 | Joshi et al. |
| 2013/0205173 A1 | 8/2013 | Yoneda |
| 2013/0219164 A1 | 8/2013 | Hamid |
| 2013/0227201 A1 | 8/2013 | Talagala et al. |
| 2013/0290607 A1 | 10/2013 | Chang et al. |
| 2013/0311434 A1 | 11/2013 | Jones |
| 2013/0311849 A1 | 11/2013 | Miyachi et al. |
| 2013/0318297 A1 | 11/2013 | Jibbe et al. |
| 2013/0332614 A1 | 12/2013 | Brunk et al. |
| 2014/0020083 A1 | 1/2014 | Fetik |
| 2014/0074850 A1 | 3/2014 | Noel et al. |
| 2014/0082715 A1 | 3/2014 | Grajek et al. |
| 2014/0086146 A1 | 3/2014 | Kim et al. |
| 2014/0090009 A1 | 3/2014 | Li et al. |
| 2014/0096220 A1 | 4/2014 | Da Cruz Pinto et al. |
| 2014/0101434 A1 | 4/2014 | Senthurpandi et al. |
| 2014/0149827 A1 | 5/2014 | Kim et al. |
| 2014/0164774 A1 | 6/2014 | Nord et al. |
| 2014/0173232 A1 | 6/2014 | Reohr et al. |
| 2014/0195636 A1 | 7/2014 | Karve et al. |
| 2014/0201512 A1 | 7/2014 | Seethaler et al. |
| 2014/0201541 A1 | 7/2014 | Paul et al. |
| 2014/0208155 A1 | 7/2014 | Pan |
| 2014/0215590 A1 | 7/2014 | Brand |
| 2014/0229654 A1 | 8/2014 | Goss et al. |
| 2014/0230017 A1 | 8/2014 | Saib |
| 2014/0258526 A1 | 9/2014 | Le Sant et al. |
| 2014/0282983 A1 | 9/2014 | Ju et al. |
| 2014/0285917 A1 | 9/2014 | Cudak et al. |
| 2014/0325262 A1 | 10/2014 | Cooper et al. |
| 2014/0351627 A1 | 11/2014 | Best et al. |
| 2014/0373104 A1 | 12/2014 | Gaddam et al. |
| 2014/0373126 A1 | 12/2014 | Hussain et al. |
| 2015/0026387 A1 | 1/2015 | Sheredy et al. |
| 2015/0074463 A1 | 3/2015 | Jacoby et al. |
| 2015/0089569 A1 | 3/2015 | Sondhi et al. |

(56) References Cited

U.S. PATENT DOCUMENTS

| | | | |
|---|---|---|---|
| 2015/0095515 | A1 | 4/2015 | Krithivas et al. |
| 2015/0113203 | A1 | 4/2015 | Dancho et al. |
| 2015/0121137 | A1 | 4/2015 | McKnight et al. |
| 2015/0134920 | A1 | 5/2015 | Anderson et al. |
| 2015/0149822 | A1 | 5/2015 | Coronado et al. |
| 2015/0193169 | A1 | 7/2015 | Sundaram et al. |
| 2015/0378888 | A1 | 12/2015 | Zhang et al. |
| 2016/0098323 | A1 | 4/2016 | Mutha et al. |
| 2016/0350009 | A1 | 12/2016 | Cerreta et al. |
| 2016/0352720 | A1 | 12/2016 | Hu et al. |
| 2016/0352830 | A1 | 12/2016 | Borowiec et al. |
| 2016/0352834 | A1 | 12/2016 | Borowiec et al. |
| 2017/0126255 | A1 | 5/2017 | Colgrove et al. |

FOREIGN PATENT DOCUMENTS

| | | | |
|---|---|---|---|
| WO | WO-2012/087648 | A1 | 6/2012 |
| WO | WO-2013071087 | A1 | 5/2013 |
| WO | WO-2014/110137 | A1 | 7/2014 |
| WO | WO-2016/015008 | A1 | 12/2016 |
| WO | WO-2016/190938 | A1 | 12/2016 |
| WO | WO-2016/195759 | A1 | 12/2016 |
| WO | WO-2016/195958 | A1 | 12/2016 |
| WO | WO-2016/195961 | A1 | 12/2016 |

OTHER PUBLICATIONS

PCMAG, *Storage Array Definition*, Published May 10, 2013. <http://web.archive.org/web/20130510121646/http://www.pcmag.com/encyclopedia/term/52091/storage-array>, 2 pages.

Google Search of "storage array define" performed by the Examiner on Nov. 4, 2015 for U.S. Appl. No. 14/725,278, Results limited to entries dated before 2012, 1 page.

Techopedia, *What is a disk array*, techopedia.com (online), Jan. 13, 2012, 1 page, URL: web.archive.org/web/20120113053358/http://www.techopedia.com/definition/1009/disk-array.

Webopedia, *What is a disk array*, webopedia.com (online), May 26, 2011, 2 pages, URL: web/archive.org/web/20110526081214/http://www.webopedia.com/TERM/D/disk_array.html.

Li et al., *Access Control for the Services Oriented Architecture*, Proceedings of the 2007 ACM Workshop on Secure Web Services (SWS '07), Nov. 2007, pp. 9-17, ACM New York, NY.

Hota et al., *Capability-based Cryptographic Data Access Control in Cloud Computing*, International Journal of Advanced Networking and Applications, col. 1, Issue 1, Aug. 2011, 10 pages, Eswar Publications, India.

Faith, *dictzip file format*, GitHub.com (online), accessed Jul. 28, 2015, 1 page, URL: github.com/fidlej/idzip.

Wikipedia, *Convergent Encryption*, Wikipedia.org (online), accessed Sep. 8, 2015, 2 pages, URL: en.wikipedia.org/wiki/Convergent_encryption.

Storer et al., *Secure Data Deduplication*, Proceedings of the 4th ACM International Workshop on Storage Security and Survivability (StorageSS'08), Oct. 2008, 10 pages, ACM New York, NY. USA, DOI: 10.1145/1456469.1456471.

ETSI, *Network Function Virtualisation (NFV); Resiliency Requirements*, ETSI GS NFCV-REL 001, V1.1.1, Jan. 2015, 82 pages, etsi.org (online), URL: www.etsi.org/deliver/etsi_gs/NFV-REL/001_099/001/01.01.01_60/gs_NFV-REL001 v010101p.pdf.

Microsoft, *Hybrid for SharePoint Server 2013—Security Reference Architecture*, Microsoft (online), Oct. 2014, 53 pages, URL: hybrid.office.com/img/Security_Reference_Architecture.pdf.

Microsoft, *Hybrid Identity*, Microsoft (online), Apr. 2014, 36 pages, URL: www.aka.ms/HybridIdentityWp.

Microsoft, *Hybrid Identity Management*, Microsoft (online), Apr. 2014, 2 pages, URL: download.microsoft.com/download/E/A/E/EAE57CD1-A80B-423C-96BB-142FAAC630139/Hybrid_Identity_Datasheet.pdf.

Bellamy-Mcintyre et al., *OpenID and the Enterprise: A Model-based Analysis of Single Sign-On Authentication*, 15th IEEE International Enterprise Distributed Object Computing Conference (EDOC), Aug. 29, 2011, pp. 129-138, IEEE Computer Society, USA, DOI: 10.1109/EDOC.2011.26, ISBN: 978-1-4577-0362-1.

Kong, *Using PCI Express As the Primary System Interconnect in Multiroot Compute, Storage, Communications and Embedded Systems*, White Paper, IDT.com (online), Aug. 28, 2008, 12 pages, URL: www.idt.com/document/whp/idt-pcie-multi-root-white-paper.

Hu et al., *Container Marking: Combining Data Placement, Garbage Collection and Wear Levelling for Flash*, 19th Annual IEEE International Symposium on Modelling, Analysis, and Simulation of Computer and Telecommunications Systems, Jul. 25-27, 2011, 11 pages, ISBN: 978-0-7695-4430-4, DOI: 10.1109/MASCOTS.2011.50.

International Search Report and Written Opinion, PCT/US2016/015006, dated Jul. 18, 2016, 12 pages.

International Search Report and Written Opinion, PCT/US2016/015008, dated May 4, 2016, 12 pages.

International Search Report and Written Opinion, PCT/US2016/020410, dated Jul. 8, 2016, 12 pages.

International Search Report and Written Opinion, PCT/US2016/032084, dated Jul. 18, 2016, 12 pages.

International Search Report and Written Opinion, PCT/US2016/016333, dated Jun. 9, 2016, 12 pages.

International Search Report and Written Opinion, PCT/US2016/016333, dated Jun. 8, 2016, 12 pages.

International Search Report and Written Opinion, PCT/US2016/035492, dated Aug. 17, 2016, 10 pages.

International Search Report and Written Opinion, PCT/US2016/036693, dated Aug. 29, 2016, 10 pages.

International Search Report and Written Opinion, PCT/US2016/038758, dated Oct. 7, 2016, 10 pages.

International Search Report and Written Opinion, PCT/US2016/040393, dated Sep. 22, 2016, 10 pages.

International Search Report and Written Opinion, PCT/US2016/044020, dated Sep. 30, 2016, 11 pages.

International Search Report and Written Opinion, PCT/US2016/044874, dated Oct. 7, 2016, 11 pages.

International Search Report and Written Opinion, PCT/US2016/044875, dated Oct. 5, 2016, 13 pages.

International Search Report and Written Opinion, PCT/US2016/044876, dated Oct. 21, 2016, 12 pages.

International Search Report and Written Opinion, PCT/US2016/044877, dated Sep. 29, 2016, 13 pages.

International Search Report and Written Opinion, PCT/US2016/058900, dated Jan. 30, 2017, 9 pages.

\* cited by examiner

ERROR CORRECTION PROCESSING IN A STORAGE DEVICE

CROSS-REFERENCE TO RELATED APPLICATION

This application is a continuation application of and claims priority from U.S. patent application Ser. No. 14/925,255, filed Oct. 28, 2015.

BACKGROUND OF THE INVENTION

Field of the Invention

The field of the invention is data processing, or, more specifically, methods, apparatus, and products for dynamically adjusting an error correction effort level of a storage device.

Description of Related Art

Enterprise storage systems can provide large amounts of computer storage to modern enterprises. Such storage systems may include many storage devices organized in such a way that data stored on a first storage device can be reconstructed from data stored on other storage devices.

SUMMARY OF THE INVENTION

Methods, apparatuses, and products for dynamically adjusting an error correction effort level of a storage device, including: receiving, from a storage array controller, an error correction effort level to perform when attempting to read data from the storage device; identifying that an attempt to read the data resulted in an error; and determining whether an amount of error correction effort level required to attempt to correct the error exceeds the error correction effort level to perform when attempting to read data from the storage device.

The foregoing and other objects, features and advantages of the invention will be apparent from the following more particular descriptions of example embodiments of the invention as illustrated in the accompanying drawings wherein like reference numbers generally represent like parts of example embodiments of the invention.

DETAILED DESCRIPTION OF EXAMPLE EMBODIMENTS

Figure 1:
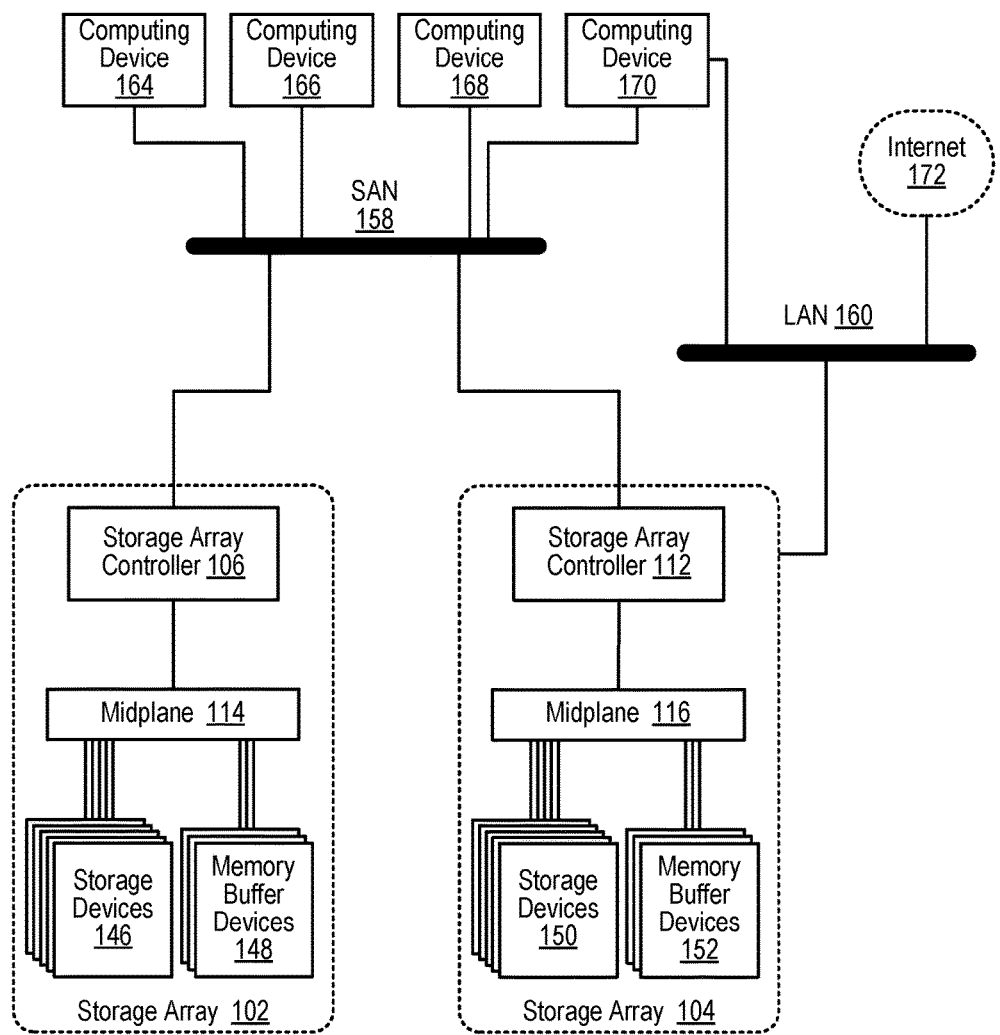
FIG. 1 sets forth a block diagram of a system for dynamically adjusting an error correction effort level of a storage device according to embodiments of the present disclosure.

Example methods, apparatus, and products for dynamically adjusting an error correction effort level of a storage device in accordance with the present disclosure are described with reference to the accompanying drawings, beginning with FIG. 1. FIG. 1 sets forth a block diagram of a system for dynamically adjusting an error correction effort level of a storage device according to embodiments of the present disclosure. The system of FIG. 1 includes a number of computing devices (164, 166, 168, 170). The computing devices (164, 166, 168, 170) depicted in FIG. 1 may be implemented in a number of different ways. For example, the computing devices (164, 166, 168, 170) depicted in FIG. 1 may be embodied as a server in a data center, a workstation, a personal computer, a notebook, or the like.

The computing devices (164, 166, 168, 170) in the example of FIG. 1 are coupled for data communications to a number of storage arrays (102, 104) through a storage area network (SAN') (158) as well as a local area network (160) ('LAN'). The SAN (158) may be implemented with a variety of data communications fabrics, devices, and protocols. Example fabrics for such a SAN (158) may include Fibre Channel, Ethernet, Infiniband, Serial Attached Small Computer System Interface ('SAS'), and the like. Example data communications protocols for use in such a SAN (158) may include Advanced Technology Attachment ('ATA'), Fibre Channel Protocol, SCSI, iSCSI, HyperSCSI, and others. Readers of skill in the art will recognize that a SAN is just one among many possible data communications couplings which may be implemented between a computing device (164, 166, 168, 170) and a storage array (102, 104). For example, the storage devices (146, 150) within the storage arrays (102, 104) may also be coupled to the computing devices (164, 166, 168, 170) as network attached storage ('NAS') capable of facilitating file-level access, or even using a SAN-NAS hybrid that offers both file-level protocols and block-level protocols from the same system. Any other such data communications coupling is well within the scope of embodiments of the present disclosure.

The local area network (160) of FIG. 1 may also be implemented with a variety of fabrics and protocols. Examples of such fabrics include Ethernet (802.3), wireless (802.11), and the like. Examples of such data communications protocols include Transmission Control Protocol ('TCP'), User Datagram Protocol ('UDP'), Internet Protocol (IF), HyperText Transfer Protocol ('HTTP'), Wireless Access Protocol ('WAP'), Handheld Device Transport Protocol ('HDTP'), Session Initiation Protocol ('SIP'), Real Time Protocol ('RTP') and others as will occur to those of skill in the art.

The example storage arrays (102, 104) of FIG. 1 provide persistent data storage for the computing devices (164, 166, 168, 170). The storage arrays (102, 104) of FIG. 1 provide persistent data storage for the computing devices (164, 166, 168, 170) at least in part through the use of one of more storage devices (146, 150). A 'storage device' as the term is used in this specification refers to any device configured to record data persistently. The term 'persistently' as used here refers to a device's ability to maintain recorded data after loss of a power source. Examples of storage devices may include mechanical, spinning hard disk drives, Solid-state drives ('SSDs'), and the like.

The storage devices of FIG. 1 may configured to dynamically adjusting an error correction effort level by: receiving, from a storage array controller, an error correction effort level to perform when attempting to read data from the storage device; identifying that an attempt to read the data resulted in an error; determining whether an amount of error correction effort level required to attempt to correct the error exceeds the error correction effort level to perform when attempting to read data from the storage device; responsive to determining that the amount of error correction effort level required to attempt to correct the error exceeds the error correction effort level to perform when attempting to read data from the storage device, returning an error condition to the storage array controller; and storing the error correction effort level to perform when attempting to read data from the storage device as a configurable parameter on the storage device, as will be described in greater detail below.

Each storage array (102, 104) depicted in FIG. 1 includes a storage array controller (106, 112). Each storage array controller (106, 112) may be embodied as a module of automated computing machinery comprising computer hardware, computer software, or a combination of computer hardware and software. The storage array controllers (106, 112) may be configured to carry out various storage-related tasks. Such tasks may include writing data received from the one or more of the computing devices (164, 166, 168, 170) to storage, erasing data from storage, retrieving data from storage to provide the data to one or more of the computing devices (164, 166, 168, 170), monitoring and reporting of disk utilization and performance, performing RAID (Redundant Array of Independent Drives) or RAID-like data redundancy operations, compressing data, encrypting data, and so on.

Each storage array controller (106, 112) may be implemented in a variety of ways, including as a Field Programmable Gate Array ('FPGA'), a Programmable Logic Chip ('PLC'), an Application Specific Integrated Circuit ('ASIC'), or computing device that includes discrete components such as a central processing unit, computer memory, and various adapters. Each storage array controller (106, 112) may include, for example, a data communications adapter configured to support communications via the SAN (158) and the LAN (160). Although only one of the storage array controllers (112) in the example of FIG. 1 is depicted as being coupled to the LAN (160) for data communications, readers will appreciate that both storage array controllers (106, 112) may be independently coupled to the LAN (160). Each storage array controller (106, 112) may also include, for example, an I/O controller or the like that couples the storage array controller (106, 112) for data communications, through a midplane (114), to a number of storage devices (146, 150), and a number of write buffer devices (148, 152).

The storage array controllers (106, 112) of FIG. 1 may be configured for dynamically adjusting an error correction effort level of a storage device, including: identifying other resources that data on a particular storage device can be rebuilt from, determining the availability of the other resources that data on the particular storage device can be rebuilt from, determining the amount of time required to rebuild data on the particular storage device from the other resources, determining an error correction effort level in dependence upon one or more of the factors described above, sending the error correction effort level to a particular storage device, receiving an error message from the particular storage device indicating that data cannot be read or reconstructed in accordance with the error correction effort level, initiating one or more processes required to rebuild data from the other resources that data on the particular storage device can be rebuilt from, and so on.

Each write buffer device (148, 152) depicted in FIG. 1 may be configured to receive, from the storage array controller (106, 112), data to be stored in the storage devices (146). Such data may originate from any one of the computing devices (164, 166, 168, 170). In the example of FIG. 1, writing data to the write buffer device (148, 152) may be carried out more quickly than writing data to the storage device (146, 150). The storage array controller (106, 112) may be configured to effectively utilize the write buffer devices (148, 152) as a quickly accessible buffer for data destined to be written to storage. In this way, the latency of write requests may be significantly improved relative to a system in which the storage array controller writes data directly to the storage devices (146, 150).

The arrangement of computing devices, storage arrays, networks, and other devices making up the example system illustrated in FIG. 1 are for explanation, not for limitation. Systems useful according to various embodiments of the present disclosure may include different configurations of servers, routers, switches, computing devices, and network architectures, not shown in FIG. 1, as will occur to those of skill in the art.

Dynamically adjusting an error correction effort level of a storage device in accordance with embodiments of the present disclosure is generally implemented with computers. In the system of FIG. 1, for example, all the computing devices (164, 166, 168, 170) and storage controllers (106, 112) may be implemented to some extent at least as computers. For further explanation, therefore, FIG. 2 sets forth a block diagram of a storage array controller (202) useful in dynamically adjusting an error correction effort level of a storage device according to embodiments of the present disclosure.

Figure 2:
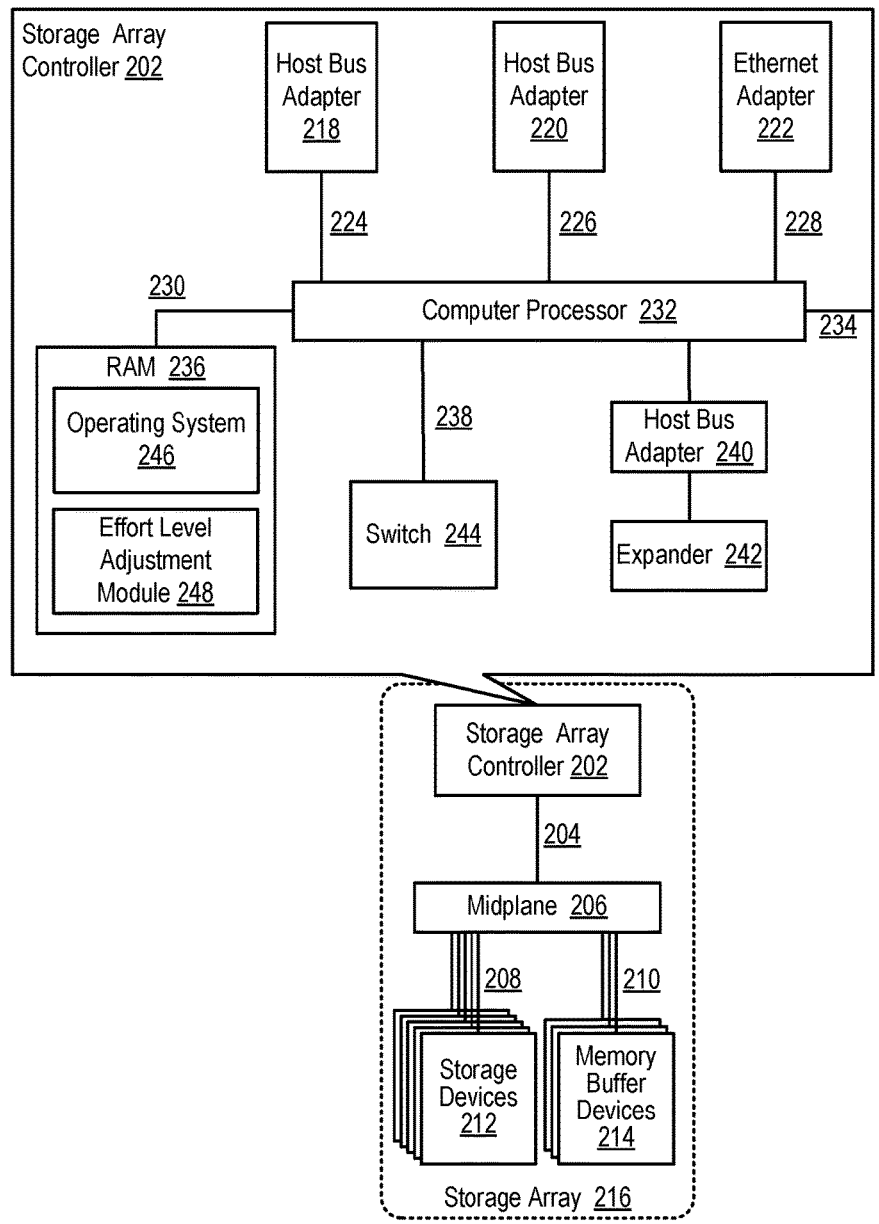
FIG. 2 sets forth a block diagram of a storage array controller (202) useful in dynamically adjusting an error correction effort level of a storage device according to embodiments of the present disclosure.

The storage array controller (202) of FIG. 2 is similar to the storage array controllers depicted in FIG. 1, as the storage array controller (202) of FIG. 2 is communicatively coupled, via a midplane (206), to one or more storage devices (212) and to one or more memory buffer devices (214) that are included as part of a storage array (216). The storage array controller (202) may be coupled to the midplane (206) via one or more data communications links (204) and the midplane (206) may be coupled to the storage devices (212) and the memory buffer devices (214) via one or more data communications links (208, 210). The data communications links (204, 208, 210) of FIG. 2 may be embodied, for example, as Peripheral Component Interconnect Express ('PCIe') bus.

The storage array controller (202) of FIG. 2 includes at least one computer processor (232) or 'CPU' as well as random access memory (RAM') (236). The computer processor (232) may be connected to the RAM (236) via a data communications link (230), which may be embodied as a high speed memory bus such as a Double-Data Rate 4 ('DDR4') bus.

Stored in RAM (214) is an operating system (246). Examples of operating systems useful in storage array controllers (202) configured for dynamically adjusting an error correction effort level of a storage device according to embodiments of the present disclosure include UNIX™, Linux™, Microsoft Windows™, and others as will occur to those of skill in the art. Also stored in RAM (236) is an effort level adjustment module (248), a module that includes computer program instructions useful in dynamically adjusting an error correction effort level of a storage device. The effort level adjustment module (248) may be configured for: identifying other resources that data on a particular storage device can be rebuilt from, determining the availability of the other resources that data on the particular storage device can be rebuilt from, determining the amount of time required to rebuild data on the particular storage device from the other resources, determining an error correction effort level in dependence upon one or more of the factors described above, sending the error correction effort level to a particular storage device, receiving an error message from the particular storage device indicating that data cannot be read or reconstructed in accordance with the error correction effort level, initiating one or more processes required to rebuild data from the other resources that data on the particular storage device can be rebuilt from, and so on, as will be described in greater detail below. Readers will appreciate that while the effort level adjustment module (248) and the operating system (246) in the example of FIG. 2 are shown in RAM (168), many components of such software may also be stored in non-volatile memory such as, for example, on a disk drive, on a solid-state drive, and so on.

The storage array controller (202) of FIG. 2 also includes a plurality of host bus adapters (218, 220, 222) that are coupled to the processor (232) via a data communications link (224, 226, 228). Each host bus adapter (218, 220, 222) may be embodied as a module of computer hardware that connects the host system (i.e., the storage array controller) to other network and storage devices. Each of the host bus adapters (218, 220, 222) of FIG. 2 may be embodied, for example, as a Fibre Channel adapter that enables the storage array controller (202) to connect to a SAN, as an Ethernet adapter that enables the storage array controller (202) to connect to a LAN, and so on. Each of the host bus adapters (218, 220, 222) may be coupled to the computer processor (232) via a data communications link (224, 226, 228) such as, for example, a PCIe bus.

The storage array controller (202) of FIG. 2 also includes a host bus adapter (240) that is coupled to an expander (242). The expander (242) depicted in FIG. 2 may be embodied as a module of computer hardware utilized to attach a host system to a larger number of storage devices than would be possible without the expander (242). The expander (242) depicted in FIG. 2 may be embodied, for example, as a SAS expander utilized to enable the host bus adapter (240) to attach to storage devices in an embodiment where the host bus adapter (240) is embodied as a SAS controller.

The storage array controller (202) of FIG. 2 also includes a switch (244) that is coupled to the computer processor (232) via a data communications link (238). The switch (244) of FIG. 2 may be embodied as a computer hardware device that can create multiple endpoints out of a single endpoint, thereby enabling multiple devices to share what was initially a single endpoint. The switch (244) of FIG. 2 may be embodied, for example, as a PCIe switch that is coupled to a PCIe bus (238) and presents multiple PCIe connection points to the midplane (206).

The storage array controller (202) of FIG. 2 also includes a data communications link (234) for coupling the storage array controller (202) to other storage array controllers. Such a data communications link (234) may be embodied, for example, as a QuickPath Interconnect ('QPI') interconnect, as PCIe non-transparent bridge ('NTB') interconnect, and so on.

Readers will recognize that these components, protocols, adapters, and architectures are for illustration only, not limitation. Such a storage array controller may be implemented in a variety of different ways, each of which is well within the scope of the present disclosure.

Figure 3:
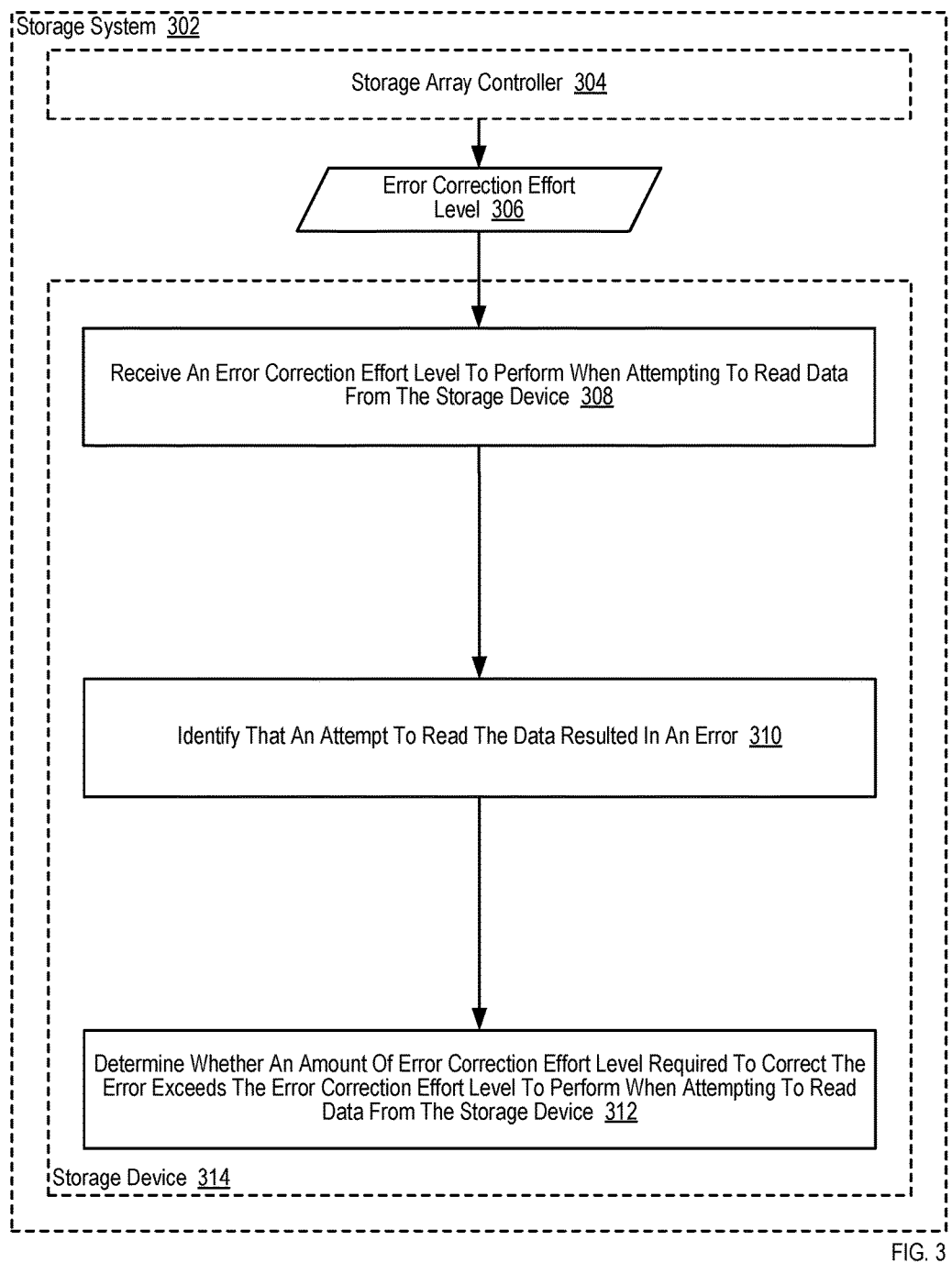
FIG. 3 sets forth a flow chart illustrating an example method for dynamically adjusting an error correction effort level of a storage device according to embodiments of the present disclosure.

For further explanation, FIG. 3 sets forth a flow chart illustrating an example method for dynamically adjusting an error correction effort level of a storage device (314) according to embodiments of the present disclosure. The storage device (314) depicted in FIG. 3 may be embodied, for example, as a hard disk drive ('HDD'), a solid-state drive ('SSD'), or other form of computer memory. Such a storage device (314) may be one or many storage devices in a larger storage system (302) such as the storage systems described above with reference to FIG. 1. The storage device (314) may be communicatively coupled to a storage array controller (304) via one or more data communications links, as is illustrated above with reference to FIG. 1 and FIG. 2.

The example method depicted in FIG. 3 includes receiving (308), from a storage array controller (304), an error correction effort level (306) to perform when attempting to read data from the storage device (314). The error correction effort level (306) to perform when attempting to read data from the storage device (314) can include quantifiable information describing the extent to which the storage device (314) should attempt to correct one or more errors that are encountered when a component (e.g., a controller) within the storage device (314) attempts to read data from the storage device (314). The error correction effort level (306) to perform when attempting to read data from the storage device (314) can specify, for example, the number additional attempts that should be made to re-read data from the storage device (314) in response to a failed initial attempt to read data from the storage device (314), the amount of time that additional attempts that should be made to re-read data from the storage device (314) in response to a failed initial attempt to read data from the storage device (314), the maximum number of errors that should be corrected with an error-correcting code ('ECC') in response to an initial attempt to read data from the storage device (314) resulting in errors, the amount of time that the storage device (314) may spend using an ECC in response to an initial attempt to read data from the storage device (314) resulting in errors, and so on.

The example method depicted in FIG. 3 also includes identifying (310) that an attempt to read the data resulted in an error. An attempt to read data may be made, for example, by a controller that resides within the storage device (314) initiating an attempt to read data from storage media (e.g., a platter, integrated circuit assemblies) within the storage device (314) that is associated with a particular address. Such an attempt to read the data may result in an error, for example, because component parts of the storage device are degrading or for a variety of other reasons. Identifying (310) that an attempt to read the data resulted in an error may be carried out, for example, by a controller that resides within the storage device (314) detecting that an attempt to read data either failed completely or resulted in errors. That is, components within the storage device (314) itself may identify (310) that an attempt to read the data resulted in an error as such components may include logic for detecting that a particular memory cell that the controller was attempting to access is non-functional, logic for detecting that parity information associated with data that was read does not match expected parity information (thereby indicating that the data may not have been read correctly), and so on.

The example method depicted in FIG. 3 also includes determining (312) whether an amount of error correction effort level required to attempt to correct the error exceeds the error correction effort level (306) to perform when attempting to read data from the storage device (314). The amount of error correction effort level required to attempt to correct the error can include quantifiable information describing the actions that must be taken by the storage device (314) in an attempt to correct one or more errors that were encountered when a previous attempt by the storage device (314) to read data resulted in an error. The amount of error correction effort level required to attempt to correct the error can be specified in terms of, for example, the number of errors that the storage device (314) must attempt to correct with an ECC in order to reconstruct data that was read during the previously executed attempt to read data from the storage device (314), the amount of time that would be required to attempt to reconstruct data that was read during the previously executed attempt to read data from the storage device (314), the amount of time that would be required to perform another attempt to read the data, and so on. Readers will appreciate that the amount of error correction effort level required to attempt to correct the error may not be known with exact precision, and as such, an estimated amount of error correction effort level required to attempt to correct the error may be utilized.

Readers will appreciate that in some instances, the amount of error correction effort level actually required to correct the error may not be known. For example, if the only corrective action to be taken in response to a failed attempt to read data is re-attempting to read the data, the storage device (314) may not be able to definitively determine that re-attempting to read the data will actually result in the data being read without error. Furthermore, the storage device (314) may not be able to definitively determine the number of additional attempts to read the data that will actually result in the data being read without error. As such, the previous paragraph can refer to the amount of error correction effort level required 'to attempt' to correct the error or an estimate of the effort level. Readers will further appreciate that in other instances, however, the amount of error correction effort level required to actually correct the error may be known. For example, if the only corrective action to be taken in response to an attempt to read data that resulted in a known number of errors is to attempt to rebuild the data using an ECC, the storage device (314) will be able to definitively determine that rebuilding the data using an ECC will actually produce the data that the storage device (314) was attempting to read. However, while the number of errors may be known, the time required for the ECC mechanism to correct that number of errors may not be known. Readers will appreciate that regardless of whether the outcome of an attempt to correct an error is known, the amount of error correction effort level required 'to attempt' to correct the error may be quantified, using estimation if necessary, and compared to the error correction effort level (306) to perform when attempting to read data from the storage device (314).

Figure 4:
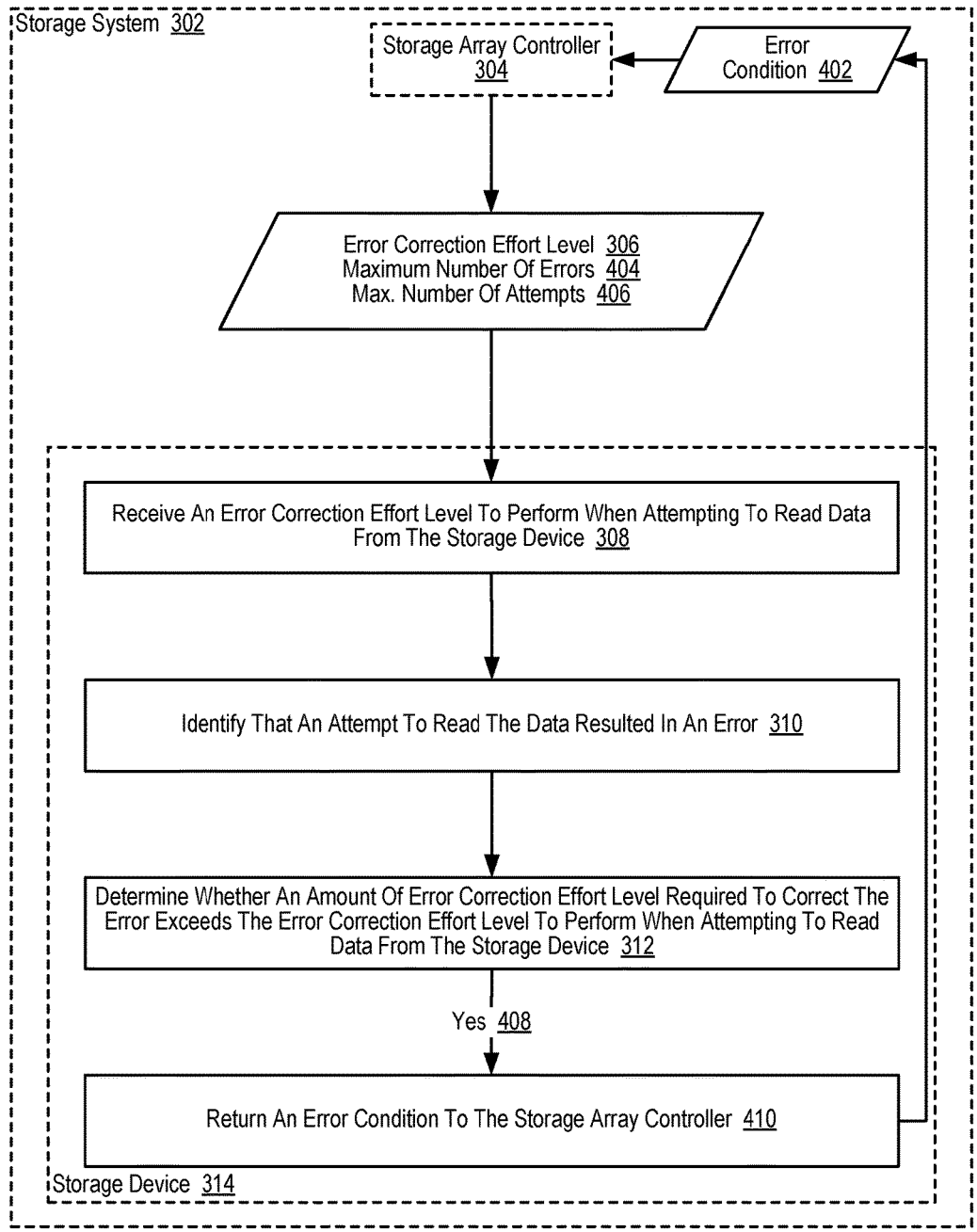
FIG. 4 sets forth a flow chart illustrating an additional example method for dynamically adjusting an error correction effort level of a storage device according to embodiments of the present disclosure.

For further explanation, FIG. 4 sets forth a flow chart illustrating an example method for dynamically adjusting an error correction effort level of a storage device according to embodiments of the present disclosure. The example method depicted in FIG. 4 is similar to the example method depicted in FIG. 3, as the example method depicted in FIG. 4 also includes receiving (308) an error correction effort level (306) to perform when attempting to read data from the storage device (314), identifying (310) that an attempt to read the data resulted in an error, and determining (312) whether an amount of error correction effort level required to attempt to correct the error exceeds the error correction effort level (306) to perform when attempting to read data from the storage device (314).

The example method depicted in FIG. 4 also includes returning (410) an error condition (402) to the storage array controller (304). The storage device (314) may return (410) an error condition (402) to the storage array controller (304) in response to affirmatively (408) determining that an amount of error correction effort level required to correct the error exceeds the error correction effort level to perform when attempting to read data from the storage device (314). The error condition (402) may be returned (410) to the storage array controller (304), for example, through the use of one more messages sent from the storage device (314) to the storage array controller (304) via a data communications link between the storage device (314) and the storage array controller (304). Such a message may be embodied as a general purpose message or even a special purpose message such as a negative-acknowledgment that is sent in response to the storage device (314) receiving, from the storage array controller (304), a request to read data from memory within the storage device (314). The error condition (402) may be returned (410) to the storage array controller (304) as an indication that the storage device (314) will not make additional attempts to read data from memory within the storage device (314) without an additional request from the storage array controller (304). In response to the receipt of the error condition (402), the storage array controller (304) may be configured to attempt to gather the data in another way such as, for example, using redundant resources to rebuild the data. Readers will appreciate that the error condition (402) returned (410) to the storage array controller (304) may be embodied as a hard error that cannot be recovered from or as a soft error that can be recovered from. In such an example, while additional resources or additional effort may be needed to recover from a soft error, no amount of additional resources or additional effort will result in the recovery from a hard error.

Consider an example in which the storage array controller (304) issues, to the storage device (314), a request to read data from a particular address on the storage device (314). In such an example, assume that the storage device (314) attempts to read the data stored at the particular address on the storage device (314), and that such an attempt results in five errors. In such an example, if the error correction effort level (306) to perform when attempting to read data from the storage device (314) specifies that the storage device (314) may use error-correcting codes to correct read attempts that contain four or fewer errors, the storage device (314) may return (410) an error condition (402) to the storage array controller (304). In such an example, the storage array controller (304) may subsequently initiate processes to reconstruct the data stored at the particular address on the storage device (314) using redundant resources. For example, if the storage device (314) is included in a RAID array, the data stored at the particular address on the storage device (314) may be reconstructed using information from other storage devices in the RAID array.

Readers will appreciate that in the example method described above, the mere fact that the error correction effort level (306) to perform specifies that the storage device (314) may use error-correcting codes to correct read attempts that contain four or fewer errors, does not necessarily mean that the storage device (314) is not capable of using error-correcting codes to correct read attempts that contain more than four errors. In fact, the storage device (314) may have access to large error-correcting codes that may be utilized to correct read attempts that contain more than four errors. The process of utilizing such error-correcting codes to correct data that contain more than four errors, however, may be more time consuming than simply reconstruct the data stored at the particular address on the storage device (314) using redundant resources. As such, the storage array controller (304) may prefer to reconstruct the data stored at the particular address on the storage device (314) using redundant resources rather than having the storage device (314) utilize the large error-correcting code to correct data that contain more than four errors.

In the example method depicted in FIG. 4, the error correction effort level (306) to perform when attempting to read data from the storage device (314) can include a maximum number of errors (404) that the storage device (314) should attempt to resolve using an error-correcting code. Alternatively, the error correction effort level (306) to perform when attempting to read data from the storage device may include a maximum number of attempts (406) that the storage device (314) should make to read the data. Readers will appreciate that the error correction effort level (306) to perform when attempting to read data from the storage device (314) may be expressed in many other units of measure such as, for example, a maximum amount of time that the storage device (314) should spend making attempts to read the data, a maximum amount of time that the storage device (314) should spend attempting to reconstruct data using an ECC, and so on.

Figure 5:
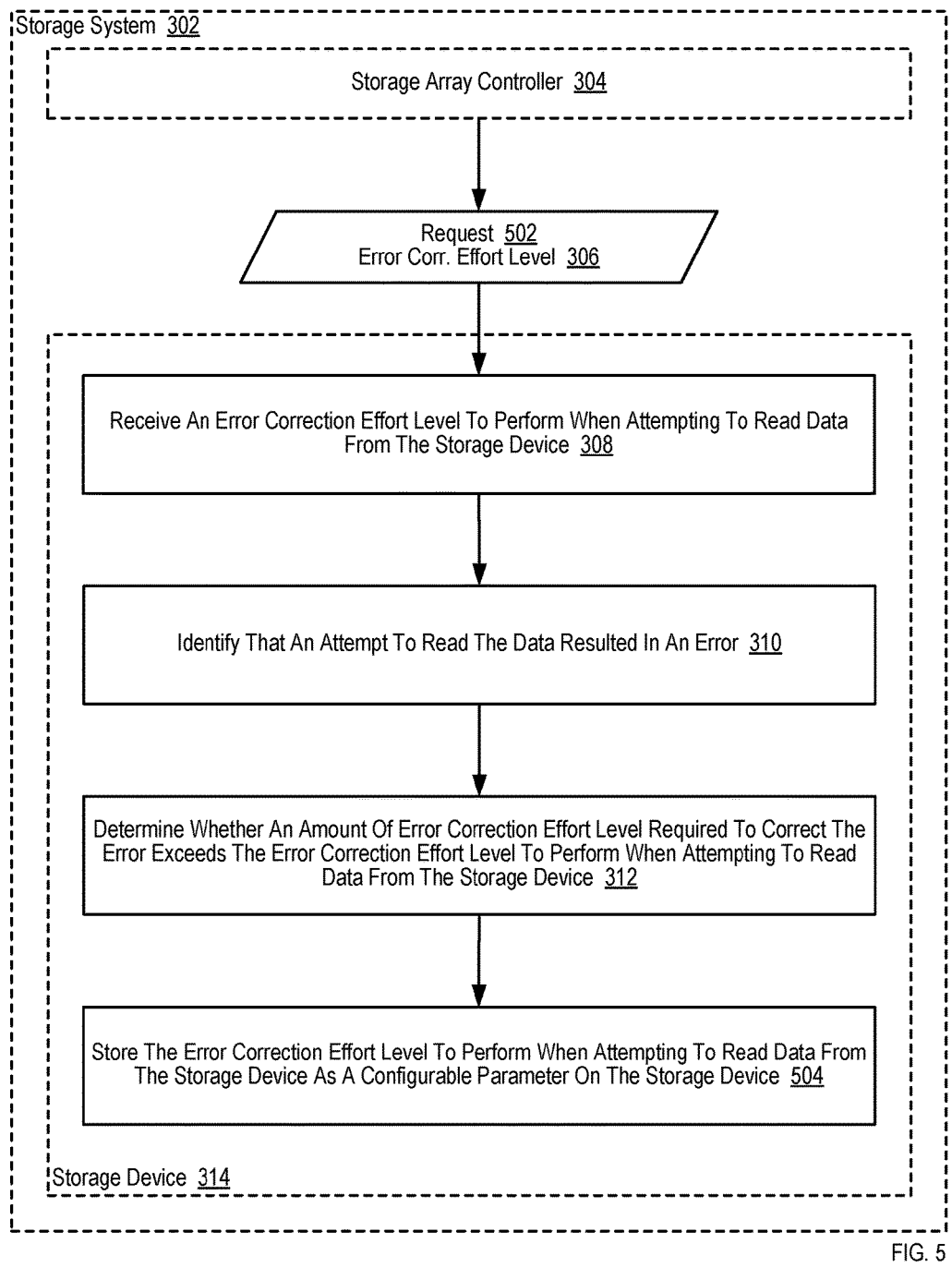
FIG. 5 sets forth a flow chart illustrating an additional example method for dynamically adjusting an error correction effort level of a storage device according to embodiments of the present disclosure.

For further explanation, FIG. 5 sets forth a flow chart illustrating an example method for dynamically adjusting an error correction effort level of a storage device according to embodiments of the present disclosure. The example method depicted in FIG. 5 is similar to the example method depicted in FIG. 3, as the example method depicted in FIG. 5 also includes receiving (308) an error correction effort level (306) to perform when attempting to read data from the storage device (314), identifying (310) that an attempt to read the data resulted in an error, and determining (312) whether an amount of error correction effort level required to attempt to correct the error exceeds the error correction effort level (306) to perform when attempting to read data from the storage device (314).

In the example method depicted in FIG. 5, the error correction effort level (306) to perform when attempting to read data from the storage device (314) may be included as a parameter in a request (502), from the storage array controller (304), to read data. By including the error correction effort level (306) to perform when attempting to read data from the storage device (314) in the request (502) to read data, the storage array controller (304) may set such an error correction effort level (306) on a request-by-request basis. In such a way, the storage array controller (304) can dynamically tailor the error correction effort level (306) to perform when attempting to read data from the storage device (314) as redundant resources become more available and less available. For example, as redundant resource become less available, the storage array controller (304) may increase the error correction effort level (306) to perform when attempting to read data from the storage device (314). The storage array controller (304) may conversely decrease the error correction effort level (306) to perform when attempting to read data from the storage device (314) as redundant resources become more available.

The example method depicted in FIG. 5 also includes storing (504) the error correction effort level (306) to perform when attempting to read data from the storage device (314) as a configurable parameter on the storage device (314). By storing (504) the error correction effort level (306) as a configurable parameter on the storage device (314), the storage array controller (304) may reduce the amount of information that is included in each request relative to including such information in each request (502) to read data. The storage array controller (304), however, can still dynamically tailor the error correction effort level (306) to perform when attempting to read data from the storage device (314) as redundant resources become more available and less available by issuing a special purpose message to the storage device (314) instructing the storage device (314) to update the configurable parameter. For example, as redundant resource become less available, the storage array controller (304) may increase the error correction effort level (306) to perform when attempting to read data from the storage device (314). The storage array controller (304) may conversely decrease the error correction effort level (306) to perform when attempting to read data from the storage device (314) as redundant resources become more available.

In the example method depicted in FIG. 5, the error correction effort level (306) to perform when attempting to read data from the storage device (314) may be determined in dependence upon the ability to rebuild the data from other sources. In the example method depicted in FIG. 5, the storage array controller (304) may be configured to determine the ability to rebuild the data from other sources and may set the error correction effort level (306) in dependence the ability to rebuild the data from other sources. The ability to rebuild the data from other sources may be expressed not only in terms of whether the data can or cannot be rebuilt from other data sources, but the ability to rebuild the data from other sources may also be expressed in terms of the amount of time that will be required to rebuild the data from other data sources, the amount of computing resources that will be required to rebuild the data from other data sources, and so on.

Consider an example in which the storage device (314) is included in a storage array that implements RAID 6. In such an example, assume that the storage device (314) is one of five storage devices used for storing stripes of data, while two additional storage devices are used for storing parity data, such that the system as a whole includes a total of seven storage devices. In such an example, data stored on the storage device (314) may be rebuilt so long as five of the seven storage devices are available. As such, the storage array controller (304) may be configured to determine the ability to rebuild the data from other sources by first determining how many of the seven storage devices in the storage array are available. In such an example, if the storage array controller (304) determines that all seven storage devices in the storage array are available, the storage array controller (304) set the error correction effort level (306) to a value such that the storage device (314) stops attempting to correct errors very quickly given that the data can reliably be reconstructed using the information contained on the other drives (including the drives that contain parity information) in the storage array. Alternatively, if the storage array controller (304) determines that only five of the seven storage devices in the storage array are available, the storage array controller (304) set the error correction effort level (306) to a value such that the storage device (314) only stops attempting to correct errors after the expiration of a relatively long period of time, given that the data cannot reliably be reconstructed using the information contained on the other drives (including the drives that contain parity information) in the storage array.

The storage array controller (304) described above with reference to FIGS. 1-5 may be configured to assist in dynamically adjusting an error correction effort level of a storage device according to embodiments of the present invention. The storage array controller (304) may be configured to assist in dynamically adjusting an error correction effort level of a storage device, for example, by: identifying other resources that data on the storage device (314) can be rebuilt from, determining the availability of the other resources that data on the storage device (314) can be rebuilt from, determining the amount of time required to rebuild data on the storage device from the other resources that data on the storage device (314) can be rebuilt from, determining an error correction effort level (306) in dependence upon one or more of the factors described above, sending the error correction effort level (306) to the storage device (314), receiving an error message from the storage device (314) indicating that data cannot be read or reconstructed in accordance with the error correction effort level (306), initiating one or more processes required to rebuild data from the other resources that data on the storage device (314) can be rebuilt from, and so on.

Example embodiments of the present disclosure are described largely in the context of a fully functional computer system for distributing management responsibilities for a storage system that includes a storage array controller and a plurality of storage devices. Readers of skill in the art will recognize, however, that the present disclosure also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the example embodiments described in this specification are oriented to software installed and executing on computer hardware, nevertheless, alternative embodiments implemented as firmware or as hardware are well within the scope of the present disclosure.

Although the examples described above depict embodiments where various actions are described as occurring within a certain order, no particular ordering of the steps is required. In fact, it will be understood from the foregoing description that modifications and changes may be made in various embodiments of the present disclosure without departing from its true spirit. The descriptions in this specification are for purposes of illustration only and are not to be construed in a limiting sense. The scope of the present disclosure is limited only by the language of the following claims.

What is claimed is:

1. A method of dynamically adjusting error correction processing within a storage device, the method comprising:
identifying, by a storage controller, that an attempt to read data from a storage device resulted in an error;
determining whether one or more controller actions to attempt to correct the error exceeds a threshold for error processing in attempting to read data from the storage device; and
processing, by the storage controller, the error from the storage device in accordance with the determination of whether the one or more controller actions to attempt to correct the error exceeds the threshold for error processing.

2. The method of claim 1 further comprising, sending, by the storage controller, the amount of error correction effort level required to attempt to correct the error when attempting to read data from the storage device.

3. The method of claim 1 wherein the threshold for error processing is based upon a maximum number of errors that the storage device should attempt to resolve using an error-correcting code.

4. The method of claim 1 wherein the threshold for error processing is based upon a maximum number of attempts that the storage device should make to read the data.

5. The method of claim 1 further comprising storing the error correction effort level to perform when attempting to read data from the storage device as a configurable parameter on the storage device.

6. The method of claim 1 wherein the error correction effort level to perform when attempting to read data from the storage device is determined in dependence upon the ability to rebuild the data from other sources.

7. An apparatus for dynamically adjusting error correction processing, the apparatus comprising a computer processor, a computer memory operatively coupled to the computer processor, the computer memory having disposed within it computer program instructions that, when executed by the computer processor, cause the apparatus to carry out the steps of:
identifying, by a storage controller, that an attempt to read data from a storage device resulted in an error;
determining whether one or more controller actions to attempt to correct the error exceeds a threshold for error processing in attempting to read data from the storage device; and
processing, by the storage controller, the error from the storage device in accordance with the determination of whether the one or more controller actions to attempt to correct the error exceeds the threshold for error processing.

8. The apparatus of claim 7 further comprising computer program instructions that, when executed by the computer processor, cause the apparatus to carry out the step of, sending, by the storage controller, the amount of error correction effort level required to attempt to correct the error when attempting to read data from the storage device.

9. The apparatus of claim 7 wherein the threshold for error processing is based upon a maximum number of errors that the storage device should attempt to resolve using an error-correcting code.

10. The apparatus of claim 7 wherein the threshold for error processing is based upon a maximum number of attempts that the storage device should make to read the data.

11. The apparatus of claim 7 further comprising storing the error correction effort level to perform when attempting to read data from the storage device as a configurable parameter on the storage device.

12. The apparatus of claim 7 wherein the error correction effort level to perform when attempting to read data from the storage device is determined in dependence upon the ability to rebuild the data from other sources.

13. A computer program product for dynamically adjusting error correction processing, the computer program product disposed upon a nontransitory computer readable medium, the computer program product comprising computer program instructions that, when executed, cause a computer to carry out the steps of:
identifying, by a storage controller, that an attempt to read data from a storage device resulted in an error;

determining whether one or more controller actions to attempt to correct the error exceeds a threshold for error processing in attempting to read data from the storage device; and processing, by the storage controller, the error from the storage device in accordance with the determination of whether the one or more controller actions to attempt to correct the error exceeds the threshold for error processing.

14. The computer program product of claim 13 further comprising computer program instructions that, when executed, cause the computer to carry out the step of, sending, by the storage controller, the amount of error correction effort level required to attempt to correct the error when attempting to read data from the storage device.

15. The computer program product of claim 13 wherein the threshold for error processing is based upon a maximum number of errors that the storage device should attempt to resolve using an error-correcting code.

16. The computer program product of claim 13 wherein the threshold for error processing is based upon a maximum number of attempts that the storage device should make to read the data.

17. The computer program product of claim 13 wherein the error correction effort level to perform when attempting to read data from the storage device is determined in dependence upon the ability to rebuild the data from other sources.

* * * * *